(12) United States Patent
Sando et al.

(10) Patent No.: US 6,838,055 B2
(45) Date of Patent: Jan. 4, 2005

(54) MICROCHIP

(75) Inventors: Yasuhiro Sando, Amagasaki (JP); Yasuhisa Fujii, Kyoto (JP)

(73) Assignee: Minolta Co., Ltd., Osaka (JP)

( * ) Notice: Subject to any disclaimer, the term of this patent is extended or adjusted under 35 U.S.C. 154(b) by 266 days.

(21) Appl. No.: 09/988,492

(22) Filed: Nov. 20, 2001

(65) Prior Publication Data

US 2002/0064483 A1 May 30, 2002

(30) Foreign Application Priority Data

Nov. 20, 2000 (JP) ........................................ 2000-352661
Oct. 1, 2001 (JP) ........................................ 2001-305237

(51) Int. Cl.[7] ........................... B01L 3/02; G01N 15/06; G01N 33/00; G01N 33/48; G01N 21/47
(52) U.S. Cl. ........................ 422/100; 422/68.1; 422/50; 422/55; 422/61; 422/63; 422/73; 422/82.05; 422/101; 422/102; 422/103; 204/193; 204/400; 204/403.01; 435/283.1; 435/287.3; 435/288.7; 436/43; 436/52; 436/53; 436/63; 436/69; 436/86; 436/89
(58) Field of Search ........................... 435/283.1, 287.3, 435/288.7; 422/50, 55, 58, 61, 63, 68.1, 73, 82.05, 100, 101, 102, 103; 204/193, 400, 403.01; 436/43, 52, 53, 63, 69, 86, 89

(56) References Cited

U.S. PATENT DOCUMENTS 5,833,926 A * 11/1998 Wurzel et al. ................. 422/81
5,858,195 A    1/1999 Ramsey ....................... 204/601
6,168,948 B1 * 1/2001 Anderson et al. ......... 435/287.2
6,375,871 B1 * 4/2002 Bentsen et al. .............. 264/1.6

OTHER PUBLICATIONS

U.S. patent application Ser. No. 09/855,371, Higashino, filed May 15, 2001.

* cited by examiner

*Primary Examiner*—Jill Warden
*Assistant Examiner*—Brian Sines
(74) *Attorney, Agent, or Firm*—Sidley Austin Brown & Wood LLP

(57) ABSTRACT

Disclosed herein is a microchip provided with a specimen flow pass, a reagent flow pass, a confluence flow pass all of which are fine flow passes. The specimen flow pass allows specimen to flow toward one end thereof. The reagent flow pass is connected to that end of the specimen flow pass and allows at least one reagent to flow for reaction with the specimen. The confluence flow pass extends from that end of the specimen flow pass and allows the confluent specimen and reagent to flow. A sensing portion is assigned near or at the confluence flow pass, and the reaction of the specimen and the reagent is capable of being detected or observed there. Further to this, the microchip comprises a force applying means for reciprocally moving the specimen and the reagent at the sensing portion. Since the reaction of the specimen and the reagent is occurred while they are reciprocally moved within the sensing portion, a length of confluence flow pass required for the reaction can be shortened, and therefore, a size of the microchip can be made compact.

24 Claims, 8 Drawing Sheets

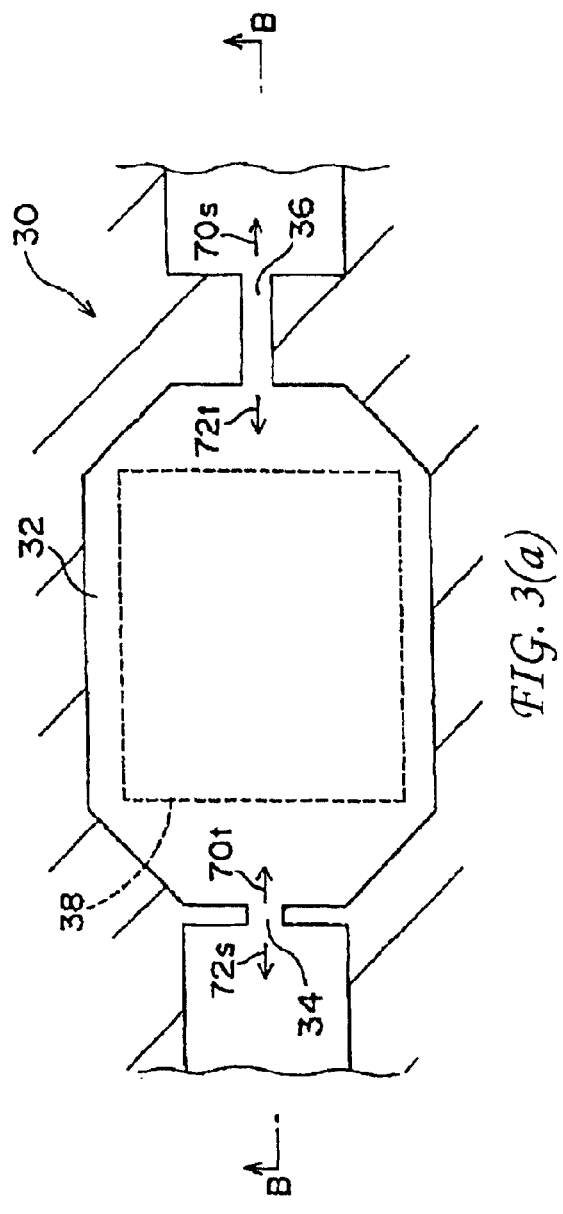
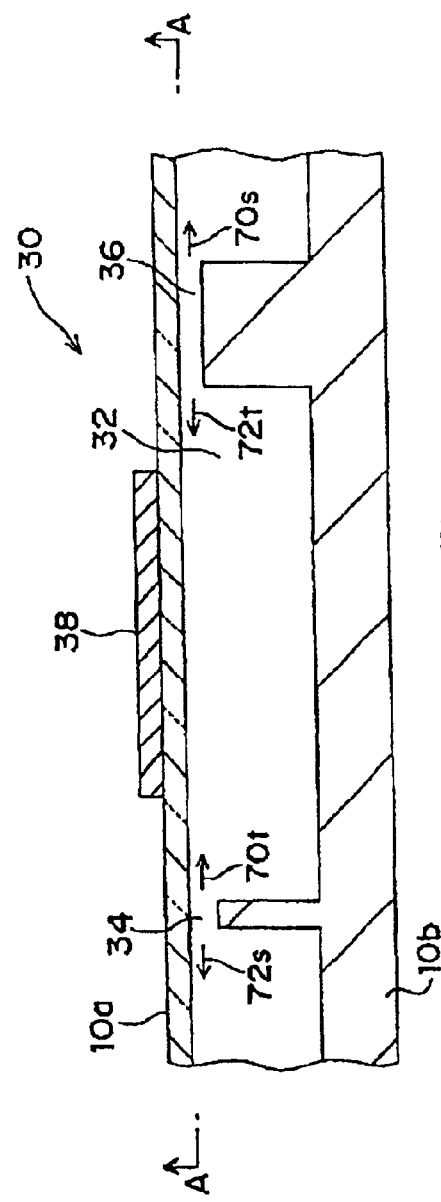
FIG. 3(a)
FIG. 3(b)

MICROCHIP

CROSS-REFERENCE TO RELATED APPLICATIONS

This application is based on Japanese Patent Application Nos. 2000-352661 and 2001-305237 filed in Japan on Nov. 20, 2000 and Oct. 10, 2001, respectively, the entire content of which is hereby incorporated by reference.

BACKGROUND OF THE INVENTION

1. Field of the Invention

The present invention relates to a microchip, and specifically relates to a microchip for detecting a reaction of a specimen and a reagent, e.g., a microchip suitable for use in blood clotting examination, immunological examination, biochemical examination, genetic examination and the like.

2. Description of the Related Art

Conventionally, devices using a light scattering detection method and devices using a magnetic sensor detection method are known as devices which, for example, measure clotting reaction in blood.

In a device using the light scattering detection method, as shown in FIG. 11 for example, light $5a$ from a light source 5 irradiates a cuvette 7 containing a liquid mixture of specimen and reagent, and the scattered light $5b$ from the specimen and reagent liquid mixture is detected by a sensor 6. The specimen can be examined because the reaction of the specimen and reagent and the intensity of the detected scattered light $5b$ have a constant correlation. This device detects a change in the static liquid mixture, and its efficacy is reduced by blood turbidity and noise induced by bubbles generated when the specimen and reagent is mixed.

In a device using the magnetic sensor detection method, as shown in FIG. 12 for example, a cuvette 7' containing a mixture of specimen and reagent and a steel ball 8 is rotated about an axis slightly inclined from the vertical, and the movement of the steel ball 8 is detected by magnetic sensor 9. For example, when the viscosity of a mixture is changed by the clotting of blood, the change in viscosity of the mixture is detected using the movement of the steel ball 8 settling to the bottom. In this device, the cuvette 7' must be rotated, and minute changes in viscosity cannot be detected.

Such conventional devices (large devices) require the collection of a certain amount of blood. Since these are immobile devices that cannot be carried, they do not correspond to point of POC (point of care, i.e., place of treatment). Furthermore, there are limits to reducing examination time and improving accuracy. They also produce large amounts of waste.

Recently, attention has focused on $\mu$-TAS ($\mu$-total analysis system) for miniaturizing devices and methods such as chemical analysis and synthesis and the like. This system is realized by an applicative of micro-machine technology. Advantages of miniaturized $\mu$-TAS include the use of small amounts of sample, reduced reaction time, and less waste product compared to conventional devices. Furthermore, when applied to the field of health care, it is expected to reduce the burden on patients by using a small amount of specimen, and lower the cost of examination by reducing the amount of reagent.

For example, Roche Diagnostics K.K. (Tokyo, Japan) has sold CoaguCheck Plus, a device which uses a microchip for mixing blood and reagent as the blood flows within a reagent chamber by capillary action, and capture the stoppage of flow of blood as a change in scattered light, and measure the time until the flow stops.

This device, however, requires an expensive microchip because a dry reagent (a regent solidified to the microchip) is used although the specimen amount is rather small at only several tens of micro liters. Furthermore, measurement accuracy of the device cannot be said so good as those of the conventional large-scale devices.

SUMMARY OF THE INVENTION

Accordingly, the present invention aims to eliminate these problems of the art by providing a microchip capable of mixing and examining specimen and reagent with an accuracy equal to a greater than conventional large-scale devices.

The present invention eliminates the problems of the art by providing a microchip having the structure described below.

A microchip reflecting one aspect of the present invention is provided with a specimen flow pass, a reagent flow pass, a confluence flow pass. All of the specimen flow pass, reagent flow pass, and confluence flow pass are fine flow passes. The specimen flow pass allows specimen to be transported toward one end thereof. The reagent flow pass is connected to that end of the specimen flow pass and allows at least one reagent to be transported for reaction with the specimen. The confluence flow pass extends from that end of the specimen flow pass, i.e., a confluence point of the specimen and reagent flow passes, and allows the confluent specimen and reagent to be transported. A sensing portion is further provided at a location adjacent to the confluence flow pass, and the reaction of the specimen and the reagent is capable of being detected or observed there. Further to this, the microchip comprises a force applying means for reciprocally moving the specimen and the reagent at the sensing portion.

In this structure, 'reagent' includes not only the reagent itself which directly reacts with the specimen, but also two or more reagents mixed first and capable of reacting with the specimen. 'Sensing portion' may be, for example, provided with a sensor which directly detects the reaction of the specimen and reagent by detecting the distortion, temperature, electric potential or the like near the confluence flow pass (e.g., piezoelectric element, thermocouple, electrically conductive part or the like), or a window through which a sensor provided outside of the microchip observes a reaction of the specimen and reagent from outside the microchip but does not directly detect the reaction itself (e.g., transparent part or the like).

According to this structure, the specimen and reagent are transported (e.g., flow or travel) toward the confluence point of the specimen and reagent flow passes, and thereafter confluent of the specimen and the reagent move within a confluence flow pass. The confluent specimen and reagent are mixed a very short time within the fine confluence flow pass. Then, the mixed specimen and reagent react, and this reaction can be detected or observed at the sensing portion. Specifically, the confluent specimen and reagent are reciprocally moved at the sensing portion and thereby react. By detecting or observing this reciprocal movement a reaction condition can be detected or observed. In a case where microparticles are contained in the confluent specimen and reagent, improved examination (for instance, improvement in examination accuracy and/or precision) can be realized.

According to this structure, examination is performed based on the same measurement principle as conventional large-scale devices because a reaction occurs even though extremely small amounts of specimen and reagent are used. Furthermore, if the specimen is extremely small in amount, the influence of turbidity of the specimen is reduced. In addition, detection sensitivity (resolution) is improved by dealing with a small reaction, thereby improving examination accuracy.

Accordingly, examination is performed at an accuracy equal to, or greater than, that of conventional large-scale devices.

When a plurality of reagents are used, for example, the reagent flow pass may be branched so as to allow the flow of a plurality of reagents, or fine flow passes may be provided so as to join flows with the specimen flow pass at a location other than an end of the specimen flow such that reagents can be transported therethrough. Furthermore, cleaning solution, or buffer solution which does not react even if mixed with the specimen and reagent may flow from fine flow passes joining the specimen flow pass, reagent flow pass, and confluence flow pass at suitable locations.

According to the above mentioned structure, a length of pass required for the reaction can be shortened since the reaction of the specimen and the reagent is occurred while they are reciprocally moved. Therefore, the microchip can be made compact and a whole system or apparatus for the detection can be made compact also.

The present invention provides a microchip having the following structure.

A microchip provided with a mixing flow pass being a fine flow pass in which a specimen can be transported. The mixing flow pass has a reagent loading unit for holding reagent to be added to and reacted with the specimen. A sensing portion at which a reaction of the specimen and the reagent is capable of being detected or observed is provided at a location adjacent to the mixing flow pass. Further, the microchip comprises a force applying means for reciprocally moving the specimen and the reagent at the sensing portion.

In this structure, the reagent loading unit may temporarily fix the reagent until reagent is added to the specimen, and the reagent separates or dissolves by contact with the specimen, or the reagent is simply received in a free moving state.

According to this structure, when specimen flows in the mixing flow pass and the specimen reaches the reagent loading unit, reagent is added to the specimen, and moves together with the specimen so as to be mixed with the specimen and react therewith. Then, the reaction of the specimen and the reagent is detectable via the sensing portion. Specifically, the mixed or confluent specimen and reagent are reciprocally moved at the sensing portion and thereby react. By detecting or observing this reciprocal movement a reaction condition can be detected or observed. In a case where microparticles are contained in the confluent specimen and reagent, improved examination (for instance, improvement in examination accuracy and/or precision) can be realized.

According to this structure, examination is performed based on the same measurement principle as conventional large-scale devices because a reaction occurs even though extremely small amounts of specimen and reagent are used. Furthermore, if the specimen is extremely small in amount, the influence of turbidity of the specimen is reduced. In addition, detection sensitivity (resolution) is improved by dealing with the small reaction, thereby improving examination accuracy.

Accordingly, examination is performed at an accuracy equal to, or greater than, that of conventional large-scale devices.

In any one of the above mentioned microchips, various structures can be employed as the force applying means. For instance, in a case where the specimen and reagent are traveled by using electrophoresis, means for applying electrical force to the specimen and reagent, e.g., a pair of electrodes, can be employed. As an another example, instead of electrical force, means for applying pressures to the liquid containing the specimen and reagent so that the liquid is reciprocally moved or flowed, e.g., a micro pump, can be employed. In this example, the microchip is desirably provided with at least one specimen flow pass, reagent flow pass, confluence flow pass, and mixing flow pass. More preferably, the micro pump is a bi-directional type that can sucking in and discharging the liquid in both directions.

It is desirable that the sensing portion has light guiding properties and extends continuously and is adjacent to the exterior of the microchip and the confluence flow pass and mixing flow pass.

According to this structure, light can be emitted to the exterior of the microchip from within the confluence flow pass or mixing flow pass through the sensing portion. In this way, for example, light emitted via the reaction of the specimen and reagent is detectable from outside the microchip. Furthermore, the scattered light, reflected light, transmitted light, or sensed image of light irradiating the specimen and reagent within the confluence flow pass or mixing flow pass can be captured, such that the reaction of the specimen and reagent is detectable thereby.

According to another aspect of the present invention, a microchip is provided with a fine flow pass in which a liquid containing a specimen can flow, and a micro pump having a first diffuser on one end and a second diffuser on the other end, wherein the first diffuser is connected to the fine flow pass. A pressure dependency of a flow pass impedance of the first diffuser is different from that of the second diffuser. Specifically the flow pass impedance of the first diffuser under a first pressuring condition of a chamber of the micro pump is greater than that of the second diffuser under the first pressuring condition. On the other hand, the flow pass impedance of the first diffuser under a second pressuring condition of the chamber is smaller than that of the second diffuser under the second pressuring condition.

According to this structure, because the first and second diffusers are different in pressure dependency of the flow pass impedance, the flow directions of the liquid can be easily altered by controlling the pressuring condition of the chamber. Reciprocal movement of the liquid in the fine flow pass can be easily achieved, therefore, a length of pass required for a reaction of the specimen and reagent can be shortened since the reaction of the specimen and the reagent is occurred while they are reciprocally moved. Therefore, the microchip can be made compact and a whole system or apparatus for the detection can be made compact also.

The present invention provides a reaction detection method below.

The reaction detection method is a method of the type wherein a reaction of a specimen and reagent is detected using a microchip having fine flow passes. The reaction detection method comprises a first step of adding reagent and microparticles to a specimen within the flow pass of the microchip, a second step of causing a reciprocal movement along the flow pass to the specimen to which the reagent and the microparticles have been added, and a third step of detecting the movement of the microparticles within the flow pass, and measuring the time until the movement of the microparticles stops.

According to this method, the specimen to which microparticles have been added and reagent can move back and forth along a flow path. The particles also move in conjunction with the back and forth movements. However, when the reaction of the specimen and reagent progresses and the viscosity of the specimen to which the reagent and particles have been added increases, the force of a specific magnitude can no longer move the specimen to which the reagent and particles have been added. In this way the movement of the particles also stops. The reaction of the specimen is detectable by detecting the time until the movement of the particles stops.

Although the change in viscosity can be detected based on the same measurement principle as in conventional large-scale devices using a steel ball by mixing particles and reagent with the specimen within a fine flow pass, a detection accuracy equal to or greater than conventional large-scale devices is obtained by using microparticles smaller than the steel ball.

In the above mentioned method, various specific structures can be employed as a means for causing the reciprocal movement. For instance, in a case where the specimen and reagent are traveled by using electrophoresis, means for applying electrical force to the specimen and reagent, e.g., a pair of electrodes, can be employed. As an another example, instead of electrical force, means for applying predetermined pressures to the liquid to which the specimen and reagent have been added, e.g., a micro pump, can be employed.

BRIEF DESCRIPTION OF DRAWINGS

These and other objects, advantages and features of the invention will become apparent from the following description thereof taken in conjunction with the accompanying drawings in which:

FIGS. 3(a) and 3(b) are cross section views of the microchip of FIG. 1;

DESCRIPTION OF THE PREFERRED EMBODIMENTS

The embodiments of the microchip of the present invention are described hereinafter with reference to the accompanying drawings.

Figure 1:
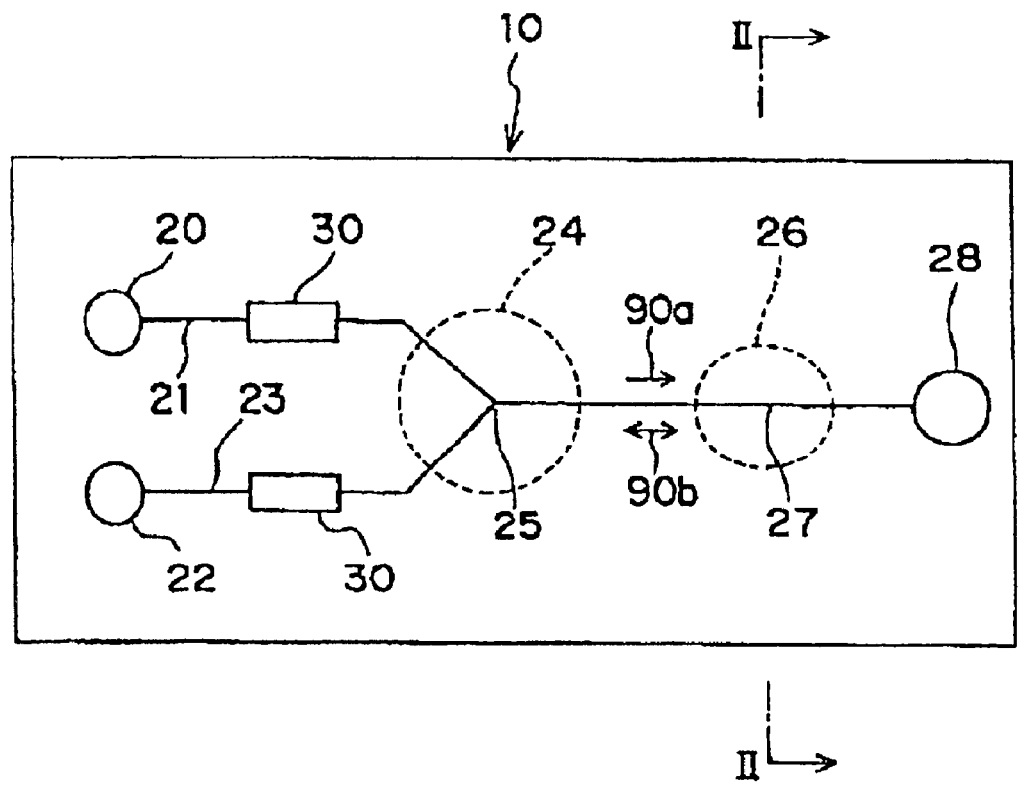
FIG. 1 is a plan view of a microchip of a first embodiment of the present invention.
Figure 2:
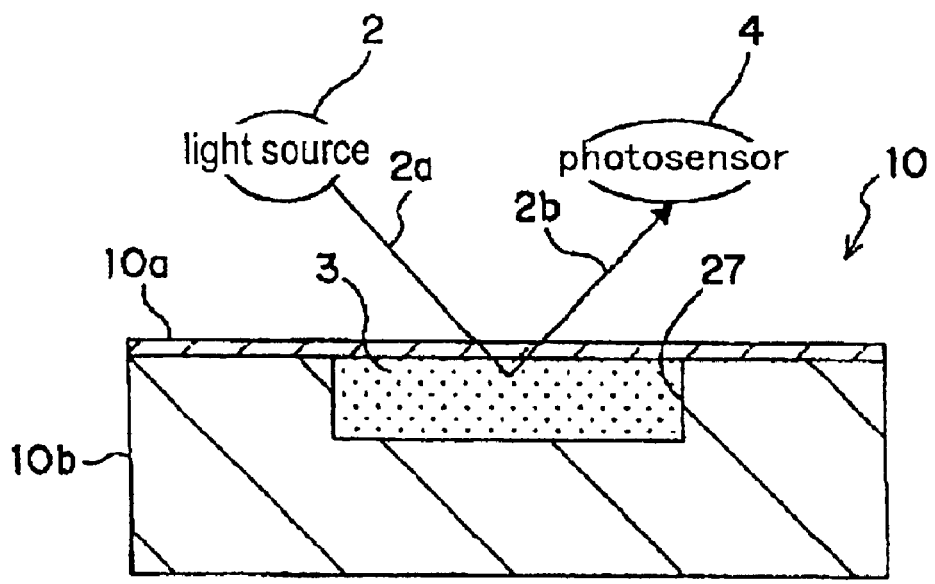
FIG. 2 is a cross section view cut along the line I—I of FIG. 1.

A microchip 10 mainly comprises fine flow passes 21, 23, 27 confluent at a single point 25 on a substrate 10b, which is covered by a cover 10a, as schematically shown in the plan view of FIG. 1 and the cross section view of FIG. 2.

For example, the external dimensions of the microchip 10 are approximately 20 mm×40 mm×0.5 mm, the width and depth of the flow passes 21, 3, 27 are approximately 300 μm and 100 μm, respectively. Materials usable for forming the microchip 10 include PMMA (polymethyl methacrylate), PDMS (polydimethylsiloxane), and like resins, parylene-coated glass materials such as photosensitive glass, heat-resistant glass, quartz glass and the like, and silicon and the like. These materials are not susceptible to specimen (blood) adhesion, and are easily processed to form fine flow passes allowing the specimen and reagent to flow. For example, silicon which can be micro-processed by etching may be used as the substrate 10b. A parylene-coated transparent heat-resistant glass may be used as the cover 10a.

Specifically, as shown in FIG. 1, a specimen inlet 20 for supplying liquid specimen (or liquid containing specimen) is provided at one end of the flow pass 21, while a reagent inlet 22 for supplying liquid reagent (or liquid containing reagent) is provided at one end of the flow pass 23. A vent hole 28 for venting air is provided at one end of flow pass 27. That is to say, the flow passes 21, 23, and 27 function as the specimen flow pass, the reagent flow pass, and the confluence flow pass, respectively.

Micro pumps 30 are incorporated in the flow pass 21 and the flow pass 23, to respectively draw specimen supplied from the specimen inlet 20 and reagent supplied from the reagent inlet 22, so as to join in confluent flow in the confluence area 24 indicated by the dotted circle, and become mixed. The confluent specimen and reagent flow in a laminar flow state within the narrow-width flow pass 27, and are mixed by diffusion. The mixing by diffusion within the fine flow pass 27 occurs in an extremely short time.

The specimen and reagent drawn by the micro pumps 30, after confluence, move through the flow pass 27 toward vent hole 28 as indicated by the arrow 90a, and the reaction of the specimen and reagent is detected in the sensing area or portion 26 indicated by the dotted circle.

The microchip 10 is installed in an examination device not shown in the illustration to detect the reaction of the specimen and reagent. The examination device (body) is provided, for example as shown in FIG. 2, a light source 2 such as an LED or the like, and photosensor 4 such as a photodiode or the like disposed above the sensor unit 26 of the microchip 10. The light source 2 emits a light 2a that irradiates the flow pass 27. The photosensor 4 receives light 2b scattered by the particles 3 within the flow pass 27. It is desirable that the optical path is shielded from the light source 2 through the flow pass 27 to the photosensor 4 to eliminate noise.

Particles may be added to the mixture of specimen and reagent. In the case of blood clot examination, for example, the particles 3 are beads of approximately several micrometers in size. The beads may be formed of silica ($SiO_2$) or the like. The beads are mixed in a buffer solution and reagent beforehand, or disposed at suitable positions at in the flow passes 21, 23, 27 beforehand.

FIGS. 3(a) and 3(b) are cross section views of the micro pump 30. The micro pump 30 is a diffuser-type pump having PZT adhered to an oscillating plate, so as to transport the fluid by unimorph drive.

That is, a ceramic piezoelectric material PZT [Pb(Zr, Ti)$O_3$] 38 is affixed to a part of the cover 10a corresponding to the pump chamber 32. The affixed part of cover 10a and PZT 38 is extended by application of a voltage to the PZT 38, such that the part corresponding to the pump chamber 32 of the cover 10a is bent to the pump chamber 32 side, reducing the volume of the pump chamber 32. At this time, a fluid passes through one of the front and back diffusers 34 and 36 due to the difference in flow pass impedance of the front and back diffusers 34 and 36, and the fluid flows from the pump chamber 32.

That is, since the front diffuser 36 produces a liquid flow in a laminar flow state whether the change in pressure of the pump chamber 32 is rapid or moderate, there is relatively little change in flow pass impedance. In contrast, the back diffuser 34 produces a relatively greater change in flow pass impedance. That is, the back diffuser 34 produces a greater flow pass impedance than the front diffuser 36 when rapidly changing the pressure of the pump chamber 32 due to the generated turbulence. On the other hand, the flow pass impedance is less than the front diffuser 36 when the pressure change in the pump chamber 32 is moderate since no turbulence is generated.

Figure 4:
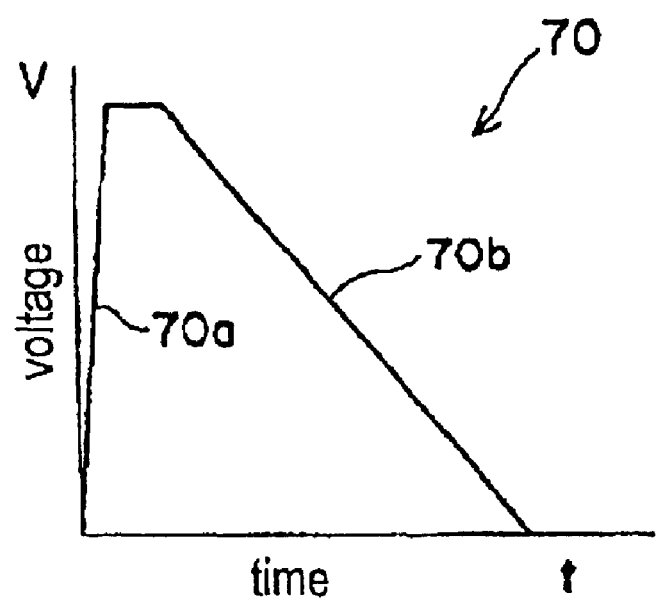
FIG. 4 is a waveform diagram of a voltage pulse.

For example, when a drive voltage having the advancing waveform 70 shown in FIG. 4 is applied to the PZT 38, the volume of the pump chamber 32 is rapidly reduced by the rapid change in voltage shown at 70a. At this time, the liquid is discharged from the front diffuser 36 as indicated by the arrow 70s in FIGS. 3(a) and 3(b). Then, the volume of the pump chamber 32 slowly returns to the original volume via the moderate change of voltage indicated at 70b in FIG. 4. At this time, liquid is suctioned into the pump chamber 32 from the back diffuser 34, as indicated at 70t in FIGS. 3(a) and 3(b). Liquid is fed forward by repeating this action. In practice, the drive voltage having the waveform 70 is repeatedly applied to the PZT 38 so that the micro pump 30 causes the liquid flowing in an intended direction.

Figure 5:
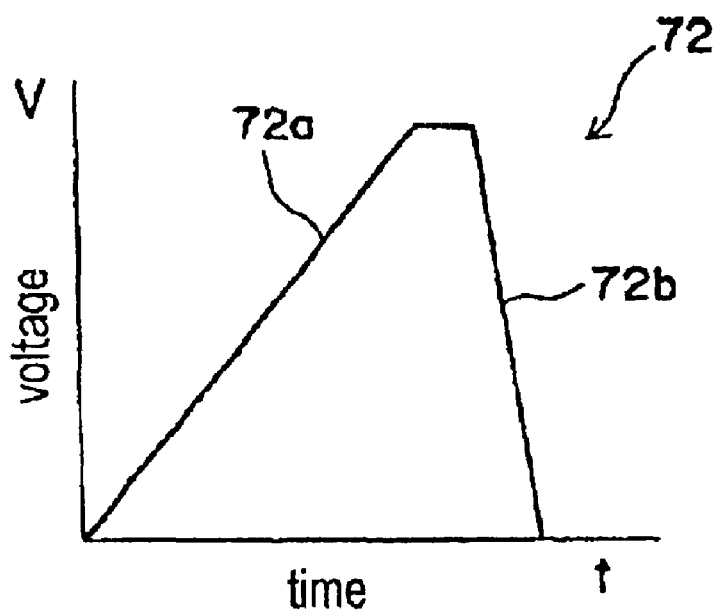
FIG. 5 is a waveform diagram of a voltage pulse.

On the other hand, when a drive voltage having the retreating waveform 72 shown in FIG. 5 is applied to the PZT 38, the volume of the pump chamber 32 is moderately reduced by the moderate change in voltage shown at 72a. At this time, the liquid of the pump chamber 32 is discharged from the back diffuser 34 as indicated by the arrow 72s in FIGS. 3(a) and 3(b). Then, the volume of the pump chamber 32 rapidly returns to the original volume via the rapid change of voltage indicated at 72b in FIG. 5. At this time, liquid is suctioned from the front diffuser 36, as indicated at 72t in FIGS. 3(a) and 3(b). Liquid is fed backward by repeating this action. In practice, the drive voltage having the waveform 70 is repeatedly applied to the PZT 38 so that the micro pump 30 causes the liquid flowing in an intended direction.

As to the driving principle and driving methods are fully disclosed in the U.S. patent application Ser. No. 09/855,371 that has been assigned to the same assignee of the present application, the content thereof are hereby incorporated by reference.

The sequence of the blood clot examination using the microchip 10 is described below.

First, an extremely small amount of specimen (blood) is supplied to the specimen inlet 20 of the microchip 10, and an extremely small amount of reagent is supplied to the reagent inlet 22.

Figure 13:
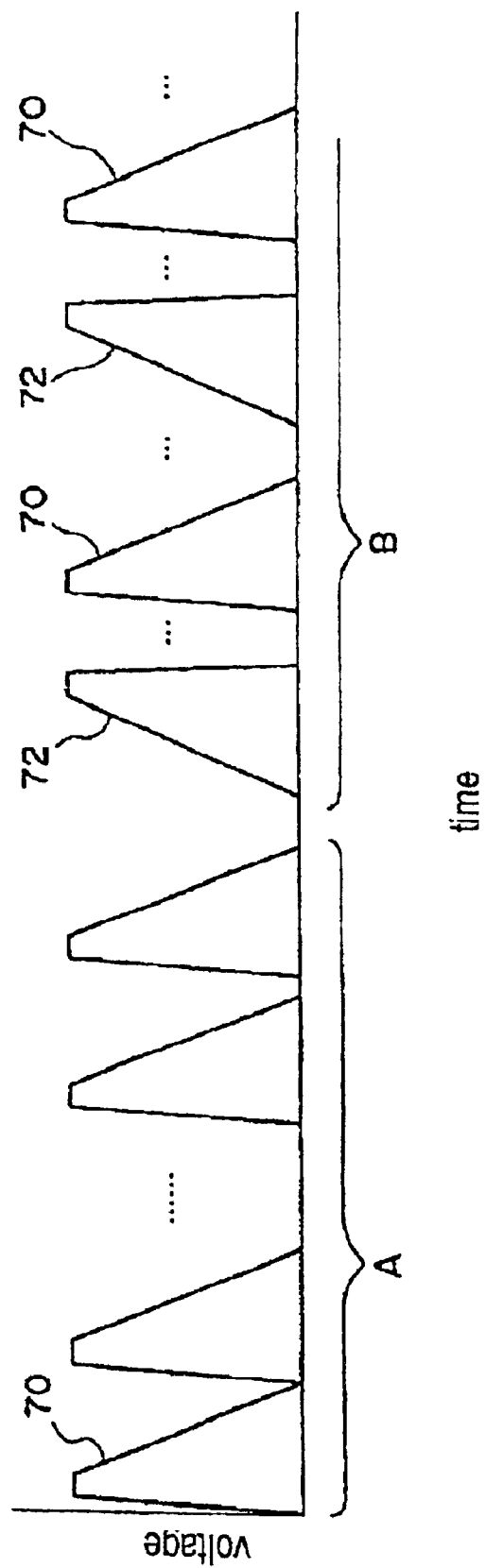
FIG. 13 is a graph of drive voltages.

Then, a drive voltage having the advancing waveform 70 is repeatedly applied, indicated by the symbol A in FIG. 13, to the PZT 38 of each micro pump 30 of the microchip 10. In this way the micro pump 30 produces confluent flow of specimen and reagent which advances within the flow pass 27. In conjunction with this action, the intensity I of the scattered light read by the photosensor 4 gradually increases until the bead distribution becomes uniform as indicated by the symbol K in FIG. 14.

Then, the liquid mixture moves forward and back as indicated by the arrow 90b in FIG. 1, and the intensity I of the scattered light is read by the photosensor 4. That is, for example, a drive voltage of retreating waveform 72 and a drive voltage of advancing waveform 70 as indicated by the symbol B in FIG. 13 are applied alternatively a specific number of times (e.g., 100 pulses) to each micro pump 30, so as to move the liquid mixture back and forth above the sensor unit 26. In conjunction with this action the beads suitably added to the mixture also move, and the intensity I of the scattered light changes slightly as indicated by the symbol L in FIG. 14.

Figure 14:
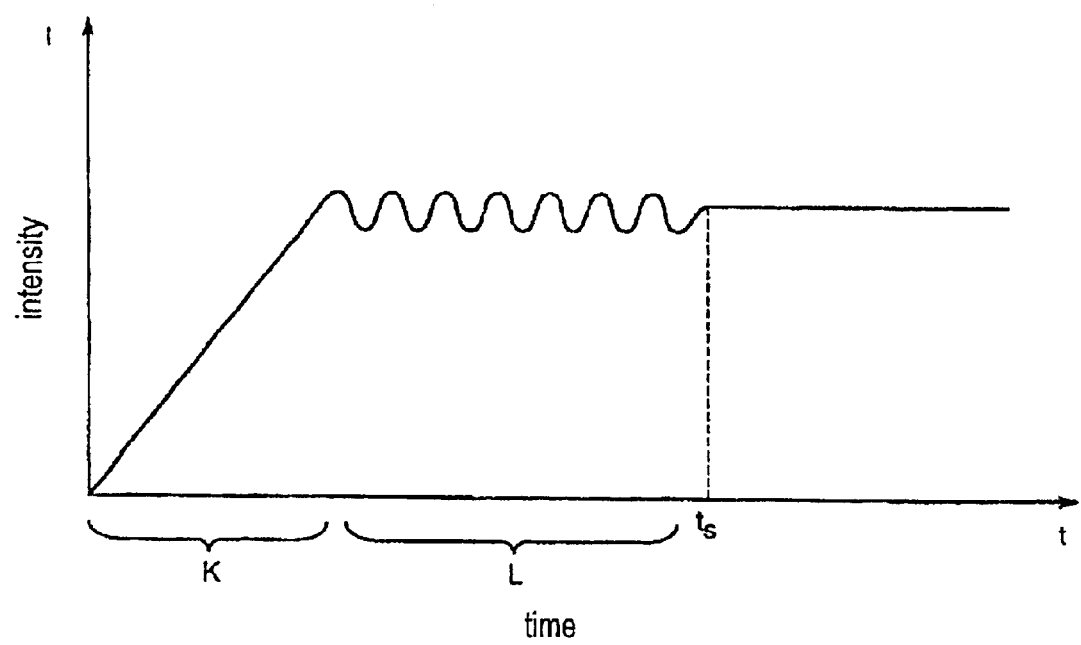
FIG. 14 is a graph of the intensity of scattered light.

When clotting progresses over time and the viscosity of the mixture increases, the mixture becomes unable to move by the specific output of the micro pump 30. Then, the beads in the mixture of the specimen and reagent also stop moving, and the intensity I of the scattered light attains a fixed value after a time ts, as shown in FIG. 14. That is, the reaction of the specimen and reagent is detectable based on the change in scattered light from the beads. The clotting time ts is measured by reading the intensity I of the scattered light, for example, at 0.1 second intervals by the photosensor 4.

Although the scattered light increases unrelated to the beads by the progress of the clotting of the blood, the change in scattered light produced by the beads appears as a high frequency component, and the change in the high frequency component alone may be detected.

As described above, the amount of specimen (blood) and reagent may be extremely small since the reaction occurs within the fine flow pass of the microchip 10.

Since blood clotting is measured by capturing the movement of beads or the like mixed in the liquid, sensitivity is better than when using steel balls and noise such as bubbles and the like is stronger than in optical measurement. Accordingly, detection accuracy is equal to or greater than a conventional large-scale device.

Although blood must be centrifuged to separate plasma when using optical measurements, the present invention is usable in examinations requiring urgency such as in the home or in an ambulance when applied to POC (point of care) since whole blood can be measured.

Furthermore, there is little dead volume because the micro pump 30 is incorporated within the microchip 30, and no specimen or reagent is wasted. By incorporating the micro pump 30 in the microchip 10, a feeding device and device for rotating the cuvette need not be placed at the side of the detection device (body), thereby allowing a more compact form-factor for the body, such that a permanent installation location in a private medical office or home is unnecessary.

Since the micro pump 30 transports the liquid bi-directionally (forward and back), the required amount of specimen and reagent for the examination can be reduced by moving the liquid back and forth above the sensing portion. For example, a specimen of several tenth milliliters (e.g., 0.2 milliliters) is detectable, which is less specimen than is used by a conventional microchip requiring several tens of milliliters of specimen.

The present invention is not limited to the previously described embodiment, and may be embodied in various modes.

Figure 7:
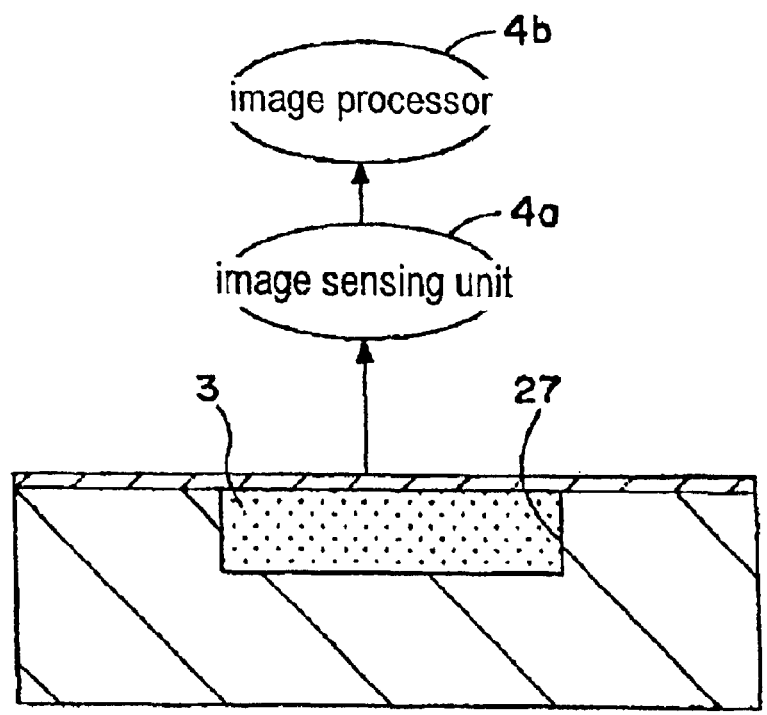
FIG. 7 is a plan view of a microchip of another modification.

For example, instead of detecting a change in data from the photosensor 4 that has only one detection portion as shown in FIG. 2, the image of the flow pass 27 may be sensed by an image sensing unit 4a (e.g., a CCD line sensor that has linearly aligned sensors, CCD area sensor that has two-dimensional matrix of sensors, or the like) which acquires a plurality of data, so as to detect clotting by observing when there is no change in an image of blood clotting compared to an image acquired a fixed time beforehand as shown in FIG. 7. For example, a change in bead distribution within the flow pass 27 can be detected based on the reaction of a specimen and a reagent by suitable processing of the binarized difference compared to an image of bead input by an image processor 4b.

Figure 6:
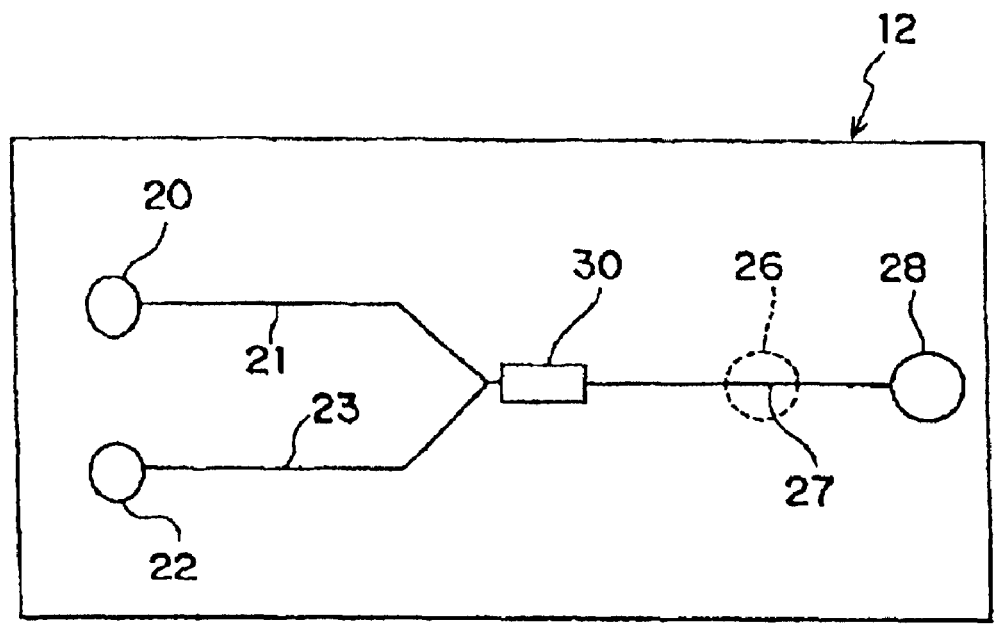
FIG. 6 is a plan view of a microchip of a modification.

Although a micro pump 30 is disposed at the two positions of the specimen flow pass 21 and the reagent flow pass 23 in FIG. 1, the micro pump 30 also may be disposed at the single position of the confluence flow pass 27 as shown in FIG. 6.

Figure 8:
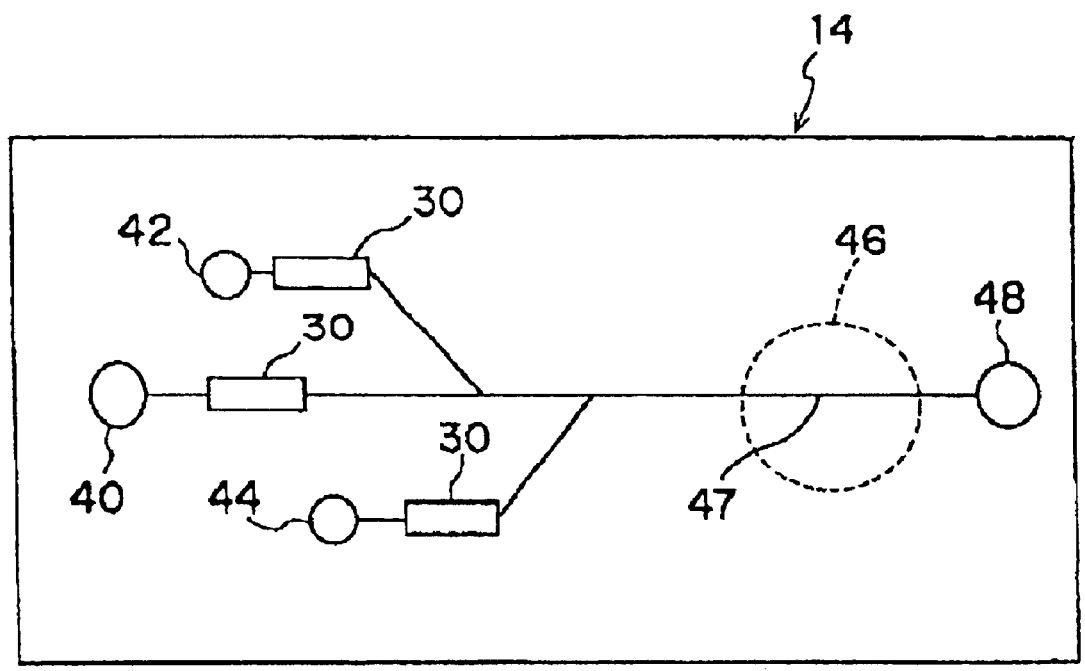
FIG. 8 is a plan view of a microchip having a two-reagent system.

Although the microchip 10 of FIG. 1 uses a single specimen and a single reagent, a single specimen and two or more reagents also may be used. For example, as shown in FIG. 8, a single specimen inlet 40 for supplying specimen, and two reagent inlets 42 and 44 for supplying reagents may be provided as in the microchip 14 using two types of reagent, such that specimen and reagents are fed by the respective micro pumps 30, and mixed in the confluence flow pass 47, and the change in the mixture is detected by the sensor unit 46. In this figure, Reference number 48 refers to a vent hole.

Figure 9:
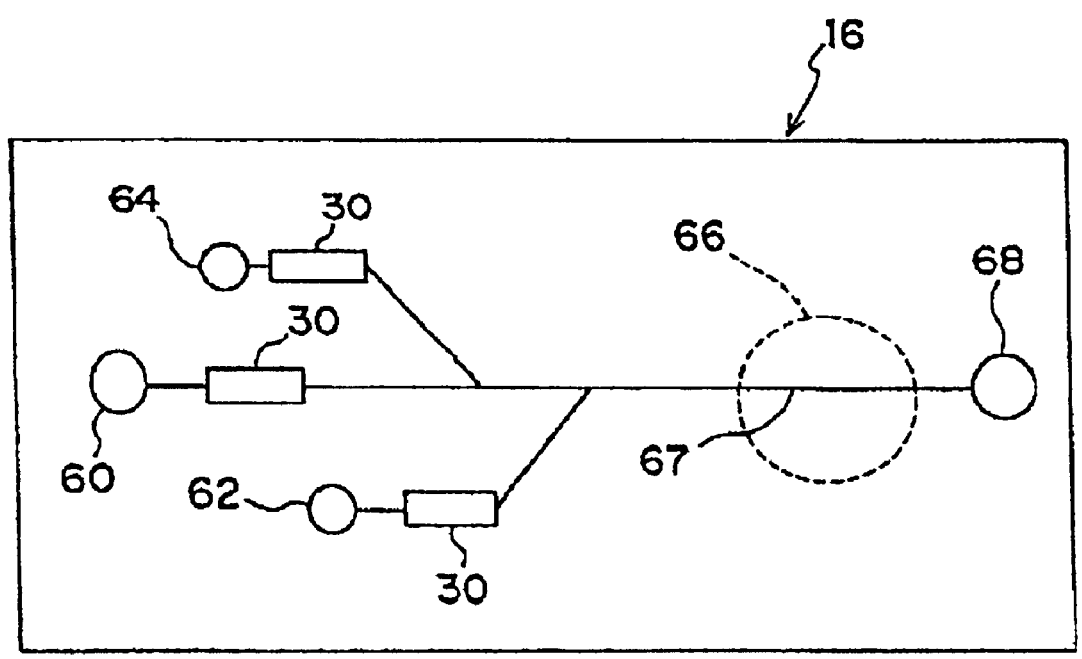
FIG. 9 is a plan view of a microchip including a buffer solution.
Figure 10:
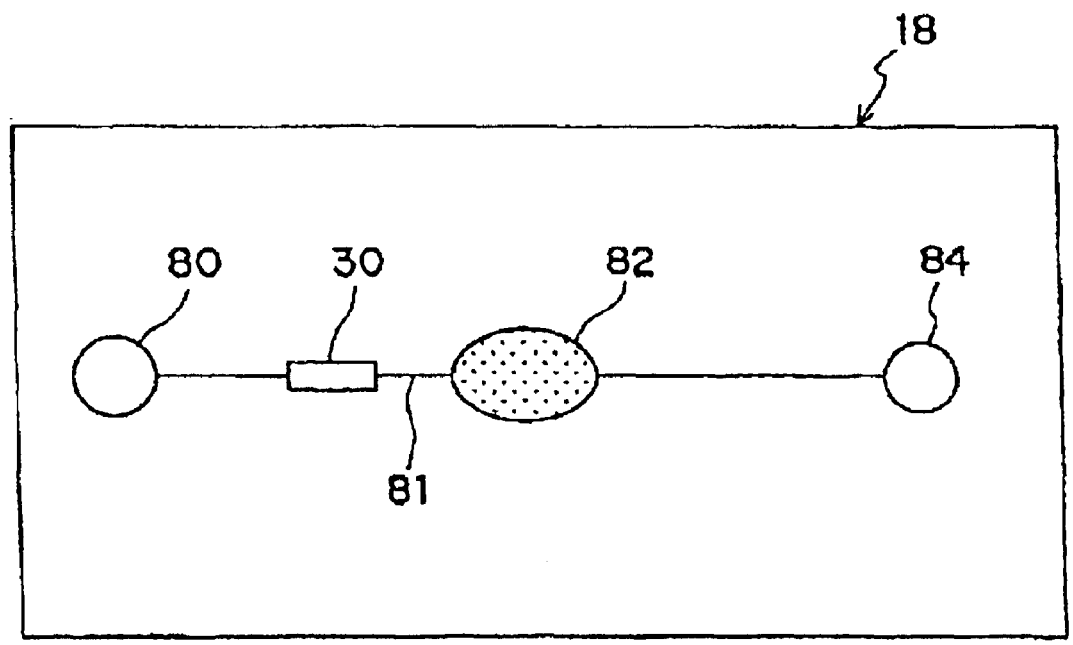
FIG. 10 is a plan view of a microchip having a solid reagent.
Figure 11:
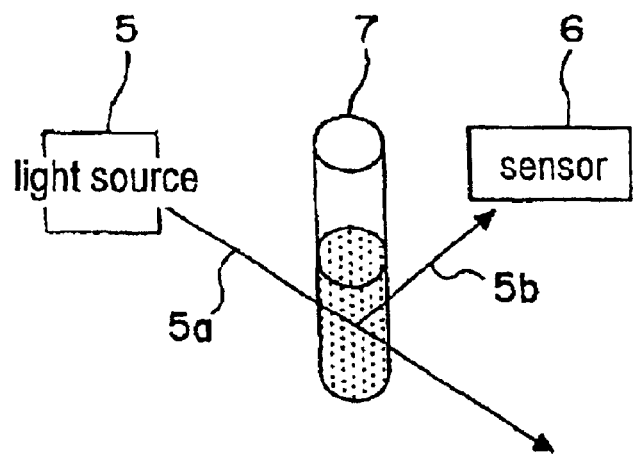
FIG. 11 illustrates an example of conventional examination.
Figure 12:
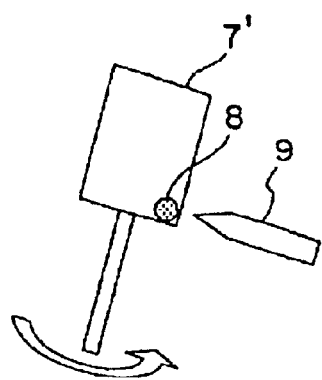
FIG. 12 illustrates another example of conventional examination.

A buffer solution also may be used in addition to reagent. For example, as shown in FIG. 9, a specimen inlet 60 for supplying specimen, a reagent inlet 62 for supplying reagent, and a buffer inlet 64 for supplying buffer solution may be provided as in the microchip 16 including a buffer solution, such that specimen, reagent, and buffer solution are fed by the respective micro pumps 30, and mixed in the confluence flow pass 67, and the change in the mixture is detected by the sensor unit 66. Reference number 68 refers to a vent hole.

The reagent need not necessarily be a liquid, inasmuch as a solid reagent may be temporarily fixed at a suitable location. For example, as shown in FIG, 10, a reagent fixing unit 82, i.e., a reagent loading unit 82, may be provided at a suitable position in a flow pass 81 between a specimen inlet 80 and a vent hole 84, such that a solid reagent 3 is temporarily fixed beforehand at the reagent fixing unit 82 as in the microchip 18. When the reagent temporarily fixed at the reagent fixing unit 82 is touched by the specimen fed from the micro pump 30, the reagent, for example, separates or dissolves and mixes with the specimen.

Although the microchip 10 of FIG. 1 includes only a single examination system comprising a set of a specimen and reagent, a plurality of mutually independent or mutually connected examination systems may be arranged within a single microchip.

The reaction of a specimen and reagent may be detected without adding particles such as beads or the like. For example, the amount of microparticles produced by a reaction of a specimen and reagent may be detected by the change in scattered light.

Reflected light or transmitted light also may be detected instead of detecting scattered light 2b. Alternatively, light emitted during a reaction of a specimen and reagent (e.g., fluorescent light) also may be detected.

Furthermore specimen and reagent within a microchip may moved from the microchip to the exterior without the micro pump 30. For example, a micro cylinder driven by a stepping motor may be connected to the specimen inlet 20 and reagent inlet 22, so as to move the specimen and reagent.

The microchip of the present invention is not limited to blood clotting examination, and may be used for various examinations.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A microchip comprising:
    a specimen flow pass that is a fine pass allowing a specimen to be transported toward one end thereof;
    a reagent flow pass that is a fine pass connected with the one end of the specimen flow pass, said reagent flow pass allowing at least one reagent to be transported for reaction with the specimen;
    a confluence flow pass that extends from the one end of the specimen flow pass, the confluence flow pass allowing the confluent specimen and reagent to be transported therethrough;
    a sensing portion provided at a position adjacent to a part of the confluence flow pass, wherein a reaction of the specimen and the reagent is capable of being detected or observed thereat;
    a micro pump which is capable of bi-directional suction and discharge of the specimen and the reagent and is provided at the specimen flow pass and the reagent flow pass or at the confluence flow pass; and
    a driver which applies a driving pulse to the micro pump to drive the micro pump for reciprocating motion.

2. A microchip claimed in claim 1, wherein the sensing portion has light guiding properties and extends continuously and is adjacent to the exterior of the microchip and the confluence flow pass and mixing flow pass.

3. A microchip as claimed in claim I, wherein the sensing portion comprises a window through which a sensor provided exterior of the microchip observes a reaction of the specimen and reagent.

4. A microchip as claimed in claim 1, wherein microparticles are contained in the confluent specimen and reagent.

5. A microchip as claimed in claim 1, wherein the reagent flow pass comprises a plurality of branches so as to allow the flow of a plurality of reagents.

6. A microchip as claimed in claim 5, wherein the branches join at a location other than the one end of the specimen flow pass.

7. A microchip comprising:
    a mixing flow pass that is a fine flow pass allowing a specimen to be transported therethrough, the mixing flow pass has a reagent loading unit for holding reagent to be added to and reacted with the specimen;
    a sensing portion, provided at a location adjacent to the mixing flow pass, at which a reaction of the specimen and the reagent is capable of being detected or observed;
    a micro pump which is capable of bi-directional suction and discharge of the specimen and the reagent and is provided at the mixing flow pass; and
    a driver which applies a driving pulse to the micro pump for reciprocating motion.

8. A microchip as claimed in claim 7, wherein the sensing portion has light guiding properties and extends continuously and is adjacent to the exterior of the microchip and the mixing flow pass.

9. A microchip as claimed in claim 8, wherein the sensing portion comprises a window through which a sensor provided exterior of the microchip observes a reaction of the specimen and reagent.

10. A microchip as claimed in claim 7, wherein microparticles are contained in a mixture of specimen and reagent.

11. A microchip as claimed in claim 7, wherein the reagent loading unit preliminarily fix the reagent until the reagent is added to the specimen.

12. A reaction detection method comprising the steps of:
   a first step of adding reagent to a specimen within a fine flow pass of a microchip;
   a second step of causing a reciprocal movement along the flow pass to the specimen to which the reagent has been added; and
   a third step of detecting a change in the reciprocal movement due to a reaction of the specimen and the reagent within the flow pass.

13. A reaction detection method as claimed in claim 12, wherein microparticles are added to the specimen in the first step, and wherein a reciprocal movement of the microparticles are detected in the third step.

14. A reaction detection method as claimed in claim 13, further comprising a fourth step of measuring a time period until the reciprocal movement of the microparticles stops.

15. A reaction detection method as claimed in claim 12, wherein pressures of a predetermined magnitude are applied to the specimen to which the reagent has been added.

16. A microchip comprising:
   a fine flow pass through which a specimen and a reagent are capable of being transported;
   a sensing portion provided adjacent to a part of the fine flow pass;
   a micro pump which is capable of bi-directional suction and discharge of the specimen and the reagent and is provided at the fine flow pass; and
   a driver which applies a driving pulse to the micro pump for reciprocating motion.

17. A microchip as claimed in claim 16, wherein the sensing portion has light guiding properties and extends continuously and is adjacent to the exterior of the microchip and the fine flow pass.

18. A microchip as claimed in claim 17, wherein the sensing portion comprises a window through which a sensor provided exterior of the microchip observes a reaction of the specimen and reagent.

19. A reaction detection device comprising:
   a specimen flow pass that is a fine pass allowing a specimen to be transported toward one end thereof;
   a reagent flow pass that is a fine pass connected with the one end of the specimen flow pass, said reagent flow pass allowing at least one reagent to be transported for reaction with the specimen;
   a confluence flow pass that extends from the one end of the specimen flow pass, the confluence flow pass allowing the confluent specimen and reagent to be transported therethrough;
   a sensing region provided at a position adjacent to a part of the confluence flow pass, wherein a reaction of the specimen and the reagent is capable of being detected or observed thereat;
   a micro pump for reciprocally moving the specimen and the reagent at the sensing region;
   a drive unit for providing a driving waveform to the micro pump, the waveform having a rise time t1 greater than or equal to a fall time t2 to move the specimen and the reagent in a first direction and have a rise time t1 less than a fall time t2 to move the specimen and the reagent in a second direction opposite the first direction.

20. A reaction detection device comprising:
   a mixing flow pass that is a fine flow pass allowing a specimen to be transported therethrough, the mixing flow pass has a reagent loading unit for holding reagent to be added to and reacted with the specimen;
   a sensing portion, provided at a location adjacent to the mixing flow pass, at which a reaction of the specimen and the reagent is capable of being detected or observed;
   a micro pump for reciprocally moving the specimen and the reagent at the sensing portion, and
   a drive unit for providing a driving waveform to the micro pump, the waveform having a rise time t1 greater than or equal to a fall time t2 to move the specimen and the reagent in a first direction and have a rise time t1 less than a fall time t2 to move the specimen and the reagent in a second direction opposite the first direction.

21. A microchip as claimed in claim 1,
   wherein the driver drives the micro pump in order to move the specimen and the reagent to the confluence flow pass within a certain period of time and, subsequently, reciprocate the confluent specimen and reagent.

22. A microchip as claimed in claim 7,
   wherein the driver drives the micro pump in order to move the specimen and the reagent to the mixing flow pass within a certain period of time and, subsequently, reciprocate the confluent specimen and reagent.

23. A reaction detection method as claimed in claim
   wherein the second step includes applying an asymmetric driving waveform to a micro pump of the microchip.

24. A microchip as claimed in claim 16,
   wherein the driver drives the micro pump in order to move the specimen and the reagent so as to mix the specimen and the reagent within a certain period of time and, subsequently, reciprocate the confluent specimen and reagent.

* * * * *

UNITED STATES PATENT AND TRADEMARK OFFICE
CERTIFICATE OF CORRECTION

PATENT NO. : 6,838,055 B2
DATED : January 4, 2005
INVENTOR(S) : Yasuhiro Sando et al.

It is certified that error appears in the above-identified patent and that said Letters Patent is hereby corrected as shown below:

Column 1,
Line 8, delete "October 10, 2001," and insert -- October 1, 2001, --.

Column 12,
Line 47, delete "in claim" and insert -- in claim 12, --.

Signed and Sealed this

Third Day of May, 2005

JON W. DUDAS
*Director of the United States Patent and Trademark Office*